June 4, 1963 J. B. RICKETTS, JR 3,092,735

SWITCHING CIRCUIT FOR A LADDER TYPE DIGITAL TO ANALOG CONVERTER UTILIZING AN ALTERNATING REFERENCE VOLTAGE

Filed March 28, 1960

INVENTOR.
James B. Ricketts, Jr.
BY
Paul J. Ethington
ATTORNEY

United States Patent Office 3,092,735
Patented June 4, 1963

3,092,735

SWITCHING CIRCUIT FOR A LADDER TYPE DIGITAL TO ANALOG CONVERTER UTILIZING AN ALTERNATING REFERENCE VOLTAGE

James B. Ricketts, Jr., Milwaukee, Wis., assignor to General Motors Corporation, Detroit, Mich., a corporation of Delaware Filed Mar. 28, 1960, Ser. No. 17,842
4 Claims. (Cl. 307—88.5)

This invention relates to a switching circuit and more particularly to a switching circuit adapted to use with an A.C. ladder type digital-to-analog converter.

A convenient digital-to-analog converter is the resistance voltage ladder which is well suited for use in conjunction with binary register devices. It is desirable to use an alternating reference source for a resistance ladder to eliminate drift problems in subsequent amplifiers. This, however, places limitations on the type of switching circuit which can be used for the bit inputs of the ladder. A switching circuit is necessary at each bit input to provide either the alternating reference voltage or ground dependent upon the binary number corresponding to each bit input.

It is the principal object of this invention to provide a switching circuit for a resistance ladder type digital-to-analog converter which utilizes an alternating reference voltage. Another object is to provide a switching circuit wherein the control input is isolated from the output terminals. A further object is to provide a switching circuit wherein the control input does not produce an extraneous output at the output terminals.

In accordance with this invention a pair of transistors are connected together at their emitters and this junction is coupled to a terminal which may be a bit input of an A.C. ladder network. One of the collectors is connected to ground and the other to an alternating reference voltage. Base-emitter bias is obtained for each transistor from one of a pair of separate transformer and rectifier networks. Only one of these networks is energized at any one time, corresponding to a binary "0" or binary "1" input. An impedance is placed in the common emitter-base circuits so that forward bias current for one transistor will reverse bias the other transistor.

Figure 1:
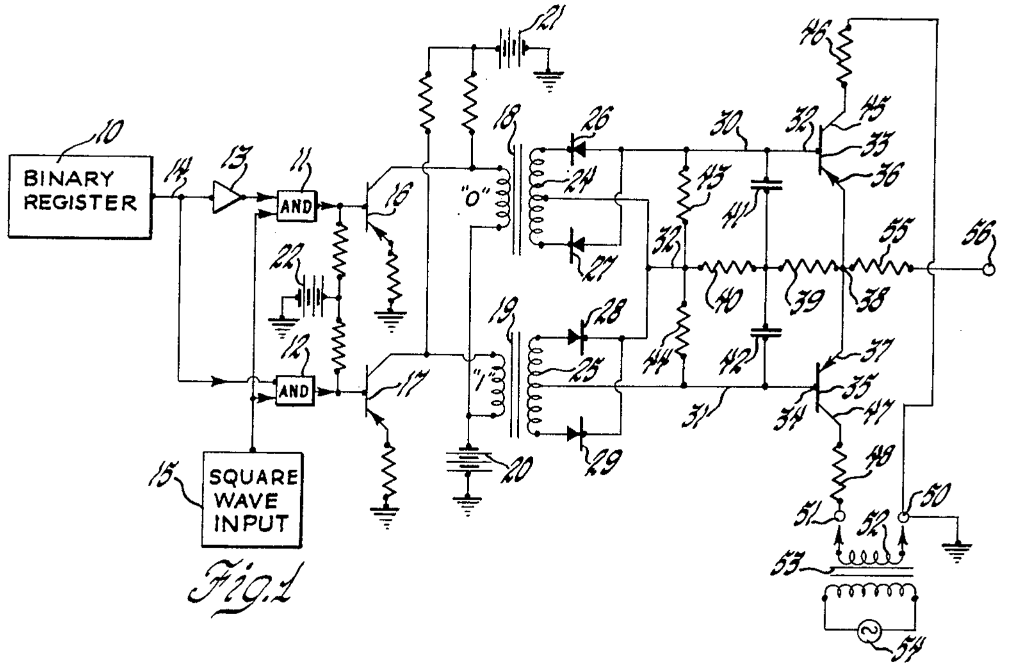
Figure 2:
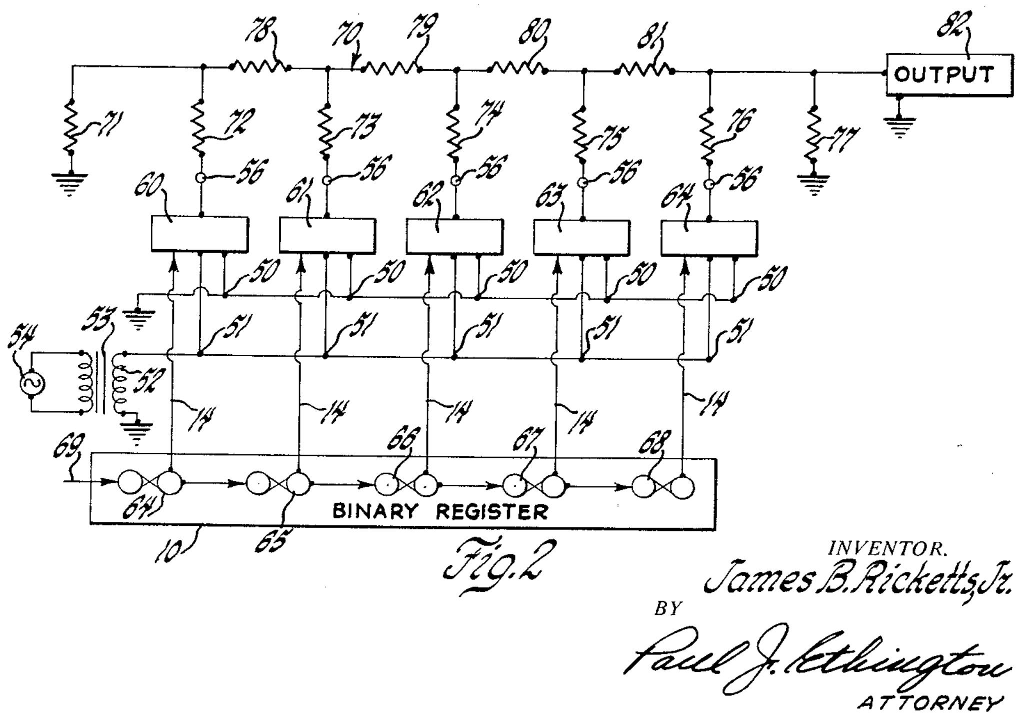

The novel features which are believed to be characteristic of the invention are set forth with particularity in the appended claims. The invention itself, however, both as to its organization and method of operation, together with further objects and advantages thereof, may best be understood by reference to the following description, taken in conjunction with the accompanying drawing, in which:

FIGURE 1 is a schematic diagram of a switching circuit incorporating the principal features of the invention; and FIGURE 2 is a diagram of a ladder network incorporating a plurality of circuits similar to that of FIGURE 1.

With reference to FIGURE 1, there is shown a binary register 10 coupled to a pair of "and" gates 11 and 12. Between the register 10 and the gate 11 an inverter circuit 13 is employed since only a single conductor 14 is used to connect the register 10 to the gates 11, 12. A square wave voltage source 15 is coupled to the other input of each of the gates 11 and 12, and the output of each of these gates is coupled to the input of one of a pair of transistors 16 and 17. These transistors are amplifying stages connected in the grounded emitter configuration and have their collectors or outputs connected through the primaries of a pair of transformers 18 and 19 to a collector supply voltage source 20. The collectors are further connected through current limiting resistors to a second source of supply voltage 21 which is effective to establish a steady state direct current through the primaries of the two transformers 18 and 19. The transistors 16 and 17 are maintained in a normally cut off operating condition or a condition of no emitter-base bias current by a bias voltage source 22.

The transformers 18 and 19 are provided with center tapped secondaries 24 and 25 to which are connected a pair of full wave rectifying circuits comprising a pair of diodes 26, 27 and a second pair of diodes 28, 29, respectively. The center tap of the secondary winding 25 is connected to a conductor 31. The positive terminals of the diodes 26, 27 are connected together and to a conductor 30 while the negative terminals of the diodes 28 and 29 are connected together and to the center tap of the secondary winding 24 and to a conductor 32. The conductor 30 is directly connected to the base 32 of a transistor 33 while the conductor 31 is directly connected to the base 34 of a transistor 35. The emitters 36 and 37 of the transistors 33 and 35 are connected together at a terminal or junction 38. Also connected to the junction 38 is a resistor 39, and the other end of this resistor is connected to a resistor 40. The magnitude of the resistor 40 is much less than that of the resistor 39. Connected between the juncture of the resistors 39 and 40 and the base 32 is a capacitor 41, and connected between this juncture and base 34 is a like capacitor 42. A pair of resistors 43, 44, having a magnitude much larger than the resistor 39, are connected between the conductor 32 and the conductors 30 and 31.

The collector electrode 45 of the transistor 33 is connected to a resistor 46 and the collector electrode 47 of the transistor 35 is connected to a like resistor 48. The other terminal of the resistor 46 is connected to a terminal 50 which is grounded. The resistor 48 is further connected to a terminal 51 while a secondary winding 52 of a transformer 53 is connected between the terminal 51 and the grounded terminal 50. The primary of the transformer 53 is driven by an alternating voltage source 54 which provides the reference voltage for the A.C. ladder circuit. The juncture 38 is connected through a resistor 55 to a terminal 56 which is a bit input terminal for a ladder network.

With reference to FIGURE 2, there is shown a resistance ladder type digital-to-analog converter employing a plurality of switches 60–64. Each of the switches 60–64 is identical to the circuit shown in FIGURE 1. The binary register 10 is shown having a plurality of serially connected bistable circuits 64–68 adapted to accumulate numerical pulses applied to an input 69 and so to provide a binary storage device. A single output from each of the bistable circuits 64–68 is coupled by a conductor 14 to one of the switching circuits 60–64. A resistance ladder 70 is shown comprised of a plurality of like resistors 71–77 connected in a ladder type network with a plurality of identical resistors 78–81, each of which have a magnitude equal to half that of the resistors 71–77. The ladder output is connected to a suitable voltage responsive or indicating device 82 having a high input impedance. The switches 60–64 are adapted to connect each of the bit input terminals 56 either to one of the grounded terminals 50 or to one of the terminals 51 upon which appears the alternating reference voltage. The binary register 10 determines which of these two possible connections is made in each of the switching circuits 60–64. If a binary "0" is present on the bistable circuit 64, for example, the corresponding switch 60 will connect the appropriate bit input terminal 56 to the grounded terminal 50. If a binary "1" is present on the bistable circuit 64, the terminal 56 or the resistor 72 will be connected to receive the alternating reference voltage from the appropriate terminal 51.

In the operation of the switching circuit shown in FIGURE 1, the input to the gates 11, 12 from the binary register 10 will be either a high voltage representing a binary "1" or a low voltage representing a binary "0." The gates 11, 12 are enabled by a high voltage and so due to the presence of the inverter 13, only one of the "and" gates 11, 12 will be enabled at any one time. Thus, the square wave voltage from the source 15 will reach only one of the transistors 16 or 17. For example, if the input from the binary register 10 is a low voltage or a binary "0," the gate 12 will not be enabled, but due to the inverter 13, a high voltage will be applied to the input of the gate 11 and so this gate will be enabled. Thus the transistor 16 will be driven alternately conductive and nonconductive by the square wave voltage from the source 15. Accordingly, no voltage will appear across the primary of the transformer 19, but a high amplitude voltage will appear across the primary of the transformer 18. The resulting voltage appearing across the secondary 24 will be full wave rectified and will appear as a pulsating negative voltage across the conductors 30 and 32. This will tend to charge the capacitor 41 such that a steady negative voltage will appear between the junction of the resistors 39, 40 and the base 32 so that current will flow across the emitter-base junction of the transistor 33 and this transistor will conduct. The current flowing between the emitter 36 and the base 32 must also flow through the resistor 39 so that the junction of the resistors 39, 40 will be positive with respect to the junction 38. Further, the line 32 will be positive with respect to the junction of the resistors 39, 40 by the amount of the pulsating current drop of the resistor 40 and so the capacitor 42 will be charged by this amount. Thus the base 34 will be positive with respect to the emitter 37 by the sum of the voltage drop across the resistor 39 and the charge on the capacitor 42. Accordingly, the transistor 35 will be cut off and the transistor 33 will be fully conductive when a voltage representing a binary "0" is presented by the binary register 10. If a binary "1" was presented, then the conditions would be reversed and the transistor 35 would be fully conductive and the transistor 33 would be cut off.

It is seen that the function of the resistor 39 is to develop a positive voltage to reverse bias the "off" transistor and to limit the emitter-base current of the "on" transistor. The function of the resistor 40 is to limit the charging current of the capacitors 41, 42 and to aid in reverse biasing the "off" transistor. The resistors 43, 44, allow the capacitors 41, 42 to discharge when the circuit switches from one conductive condition to the other or from a binary "0" to a binary "1" condition.

A condition of operation of one of the switches 60–64 of FIGURE 2, for example the switch 60, will be examined wherein the transistor 35 is "on" and the transistor 33 is "off." This corresponds with a binary "1" output from the bistable circuit 60. It will be assumed that the remaining switches 61–64 are in the binary "0" condition. In one portion of the cycle of the alternating reference voltage source 54, the terminal 51 will be negative with respect to the grounded terminal 50. During this portion, the emitter-collector circuit of the transistor 35 will be forward biased and current can readily flow from the terminal 56 through the secondary 52 to ground or, in other words, the resistor 72 will be connected to the alternating reference voltage. In a second or crossover portion of the cycle of the alternating reference source, the voltage between terminals 51 and 50 will be zero. Here the net voltage from the terminal 38 through the resistor 55, the ladder 70, ground, the secondary winding 52, and the resistor 48 will be equal to the emitter-base drop of the transistor 35. Thus, the emitter-base drop should be as small as is possible since this represents an extraneous input to the ladder. Part of this emitter-base drop will be absorbed by the collector-base junction, but in any case, with the input circuit shown, the extraneous input to the ladder is negligible, even if all of the switches 60–64 were in the binary "1" condition. Another state to be considered is the portion of the cycle when the terminal 51 is positive with respect to the terminal 50. Here the transistor is reverse biased, the collector 47 being positive with respect to the emitter 37. However, it is seen that the base 34 is at some small negative voltage with respect to the emitter 37 while the collector 47 is at some relatively large positive voltage with respect to the emitter 37. Thus, current will start to flow across the collector-base junction. Only a limited amount of current, however, will flow into the base electrode and so the rest of this current will cross the base-emitter junction into the emitter 37. It is apparent that the current flowing into the ladder 70 from the secondary 52 will also flow through the resistor 48, the resistor 55, and ladder 70 and that the only contribution that the transistor 35 makes is the nominal voltage drop. Thus, the operation is essentially the same as when the terminal 51 is negative with respect to terminal 50.

If the switching circuit 60 is examined in a condition wherein the transistor 35 is on and the remainder of the switches 61–64 are also in the binary "1" condition or connected to the alternating reference voltage, then it is seen that some alternating voltage will appear at the terminals 56 looking into the ladder, and the alternating voltage across the transistor 35 will not be the full alternating reference voltage. The voltage from the ladder 70 to the switch 60, however, will never exceed the reference voltage supplied to the switch due to the configuration of the circuit.

In an examination of the operation of the switch 60 while the transistor 33 is in the "on" condition or when there is a binary "0" input from the bistable circuit 64, it is seen that this operation is similar to that when the transistor 35 is in the "on" state. In this case, however, the voltage source is in the ladder 70. The alternating reference voltage across the secondary winding 52 does not reach the terminal 38 since the transistor 35 is completely cut off. If the remainder of the switches 61–64 are also in the grounded or binary "0" condition, then action is similar to the state described above wherein there was no voltage drop across the terminals 51 and 50.

The operation of the transistor 33 will be considered when it is in its "off" state or when a binary "1" is present at the bistable circuit 64. It will be assumed that all of the remaining switches 61–64 are also in the binary "1" state or connected to the alternating reference voltage. In this case, the junction 38 follows the potential of the terminal 51 since the transistor 35 is fully conductive. When the terminal 51 is positive with respect to the terminal 50, the transistor 33 has a forward emitter-collector bias, but remains "off" since the base 32 is positive with respect to both the emitter 36 and the collector 45. When the terminal 51 is at a potential equal to that of the terminal 50, or during the crossover points of the alternating reference voltage, the base 34 will likewise be positive with respect to both emitter 36 and collector 45, and so the transistor will still be fully cut off. When the terminal 51 is negative with respect to the terminal 50, the collector 45 will be highly positive with respect to the emitter 36. To prevent the transistor 33 from conducting at this time due to collector-base current, the base-emitter voltage must be higher than the peak value of the alternating reference voltage across the terminals 51, 50. This condition can be met by proper selection of the amplifier circuit of transistor 16 and the turns ratio of the transformer 18. Thus, the requirement for the "off" transistor to be fully off is that the drop across the resistor 39, plus the charge on the appropriate capacitor 41, 42, add up to a voltage greater than the peak voltage of the alternating reference voltage input.

While there has been illustrated a particular embodiment of the invention, it will of course be understood that the invention is not limited thereto. Various modifications may be made by persons skilled in the art, and it is contemplated that the appended claims will cover any such modifications as fall within the true scope of the invention.

I claim:

1. A switching circuit comprising first and second transistors each having base, emitter, and collector electrodes, the emitters of said first and second transistors being connected together at a juncture, a resistor having first and second terminals, said first terminal being connected to said juncture, first and second mutually exclusive and opposing unidirectional voltage sources, said first source being connected between the base of said first transistor and said second terminal, said second source being connected between the base of said second transistor and said second terminal whereby said first and second transistors are alternately conductive, a voltage source connected between the collector of said second transistor and a common point, the collector of said first transistor being connected to said common point, and output means connected between said juncture and said common point.

2. A switching circuit comprising first and second transistors each having base, emitter, and collector electrodes, the emitters of said first and second transistors being connected together at a juncture, a resistor having first and second terminals, said first terminal being connected to said juncture, a first capacitor connected between the base of said first transistor and said second terminal, a second capacitor connected between the base of said second transistor and said second terminal, first and second alternating signal sources, first rectifying means having an input connected to said first signal source and an output connected between the base of said first transistor and said second terminal, second rectifying means having an input connected to said second signal source and an output connected between the base of said first transistor and said second terminal, a voltage source connected between the collector of said second transistor and a common point, the collector of said first transistor being connected to said common point, and output means connected between said juncture and said common point.

3. A switching circuit comprising first and second gating devices each having first, second, and third terminals, conduction between said first and third terminals being determined by current flowing through said first and second terminals, the first terminals of said first and second gating devices being connected together at a juncture, a resistor having one terminal connected to said juncture, a first capacitor connected between the second terminal of said first gating device and the other terminal of said resistor, a second capacitor connected between the second terminal of said second gating device and said other terminal of said resistor, first and second signal sources, first and second transformers having the primaries thereof connected across said first and second signal sources respectively, first rectifying means having an input connected to the secondary of said first transformer and an output connected between the second terminal of said first gating means and said other terminal of said resistor, second rectifying means having an input connected to the secondary of said second transformer and an output connected between the second terminal of said second gating means and said other terminal of said resistor, an alternating voltage source connected between the third terminal of said second gating means and a common point, the third terminal of said first gating means being connected to said common point, and output means connected between said juncture and said common point.

4. A switching circuit comprising first and second transistors each having base, emitter, and collector electrodes, the emitters of said first and second transistors being connected together at a juncture, a first resistor having one terminal connected to said juncture, a first capacitor connected between the base of said first transistor and the other terminal of said first resistor, a second capacitor connected between the base of said second transistor and said other terminal, first and second signal sources, first and second transformers having the primaries thereof connected across said first and second signal sources respectively, first rectifying means having an input connected to the secondary of said first transformer and an output connected between the base of said first transistor and a junction point, second rectifying means having an input connected to the secondary of said second transformer and an output connected between the base of said second transistor and said junction point, a second resistor connected between said junction point and said other terminal of said first resistor, an alternating voltage source connected between the collector of said second transistor and a common point, the collector of said first transistor being connected to said common point, and output means connected between said juncture and said common point.

References Cited in the file of this patent

UNITED STATES PATENTS

| | | |
|---|---|---|
| 2,873,384 | Schoen et al. | Feb. 10, 1959 |
| 2,953,695 | Rywak | Sept. 20, 1960 |
| 2,956,272 | Cohler et al. | Oct. 11, 1960 |